(12) United States Patent  
Ootake et al.

(10) Patent No.: US 7,999,391 B2  
(45) Date of Patent: Aug. 16, 2011

(54) MULTILAYERED WIRING STRUCTURE, AND METHOD FOR MANUFACTURING MULTILAYERED WIRING

(75) Inventors: Hiroto Ootake, Tokyo (JP); Masayoshi Tagami, Tokyo (JP); Munehiro Tada, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 388 days.

(21) Appl. No.: 12/278,339

(22) PCT Filed: Feb. 6, 2007

(86) PCT No.: PCT/JP2007/052056  
§ 371 (c)(1),  
(2), (4) Date: Jan. 29, 2009

(87) PCT Pub. No.: WO2007/091574  
PCT Pub. Date: Aug. 16, 2007

(65) Prior Publication Data  
US 2010/0219533 A1    Sep. 2, 2010

(30) Foreign Application Priority Data  
Feb. 6, 2006    (JP) .................................. 2006-027886

(51) Int. Cl.  
*H01L 29/40* (2006.01)

(52) U.S. Cl. .................. 257/774; 257/E21.577; 438/622
(58) Field of Classification Search .................. 257/774, 257/E23.145, E23.169, E21.576, E21.577, 257/E21.585; 438/622–624, 638  
See application file for complete search history.

(56) References Cited

U.S. PATENT DOCUMENTS 6,730,594 B2 * 5/2004 Noguchi et al. .............. 438/653  
7,825,516 B2 * 11/2010 Chiras et al. .................. 257/774

FOREIGN PATENT DOCUMENTS

JP    2000-294634 A    10/2000  
JP    2005-203476 A    7/2005

* cited by examiner

*Primary Examiner* — David Vu  
(74) *Attorney, Agent, or Firm* — Sughrue Mion, PLLC

(57) ABSTRACT

Provided is a wiring of the Damascene structure for preventing the TDDB withstand voltage degradation and for keeping the planarity to prevent the degradation of a focus margin. A trench wiring (213) is formed in an interlayer insulating film, which is composed of a silicon carbide-nitride film (205), a SiOCH film (206) and a silicon oxide film (207) [(e)]. The silicon oxide film (207) is etched at a portion adjacent to the wiring of a polished surface by dry etching or wet etching [(f)]. A silicon carbide-nitride film (SiCN) (214) is formed as a Cu cap film [(g)]. An interlayer insulating film is further formed thereon to form a conductive plug, a trench wiring and so on.

22 Claims, 16 Drawing Sheets

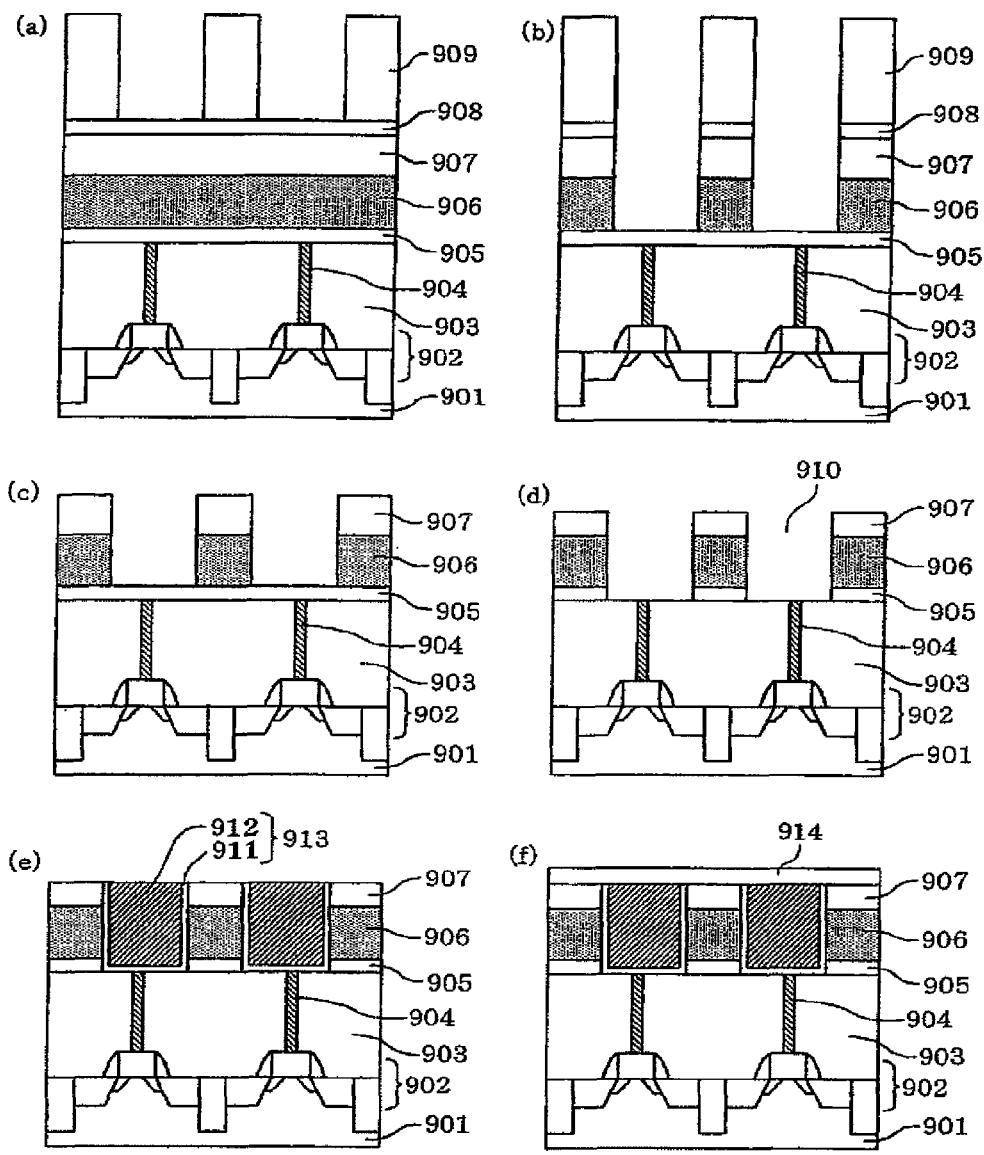
[FIG.1]

[FIG.2]
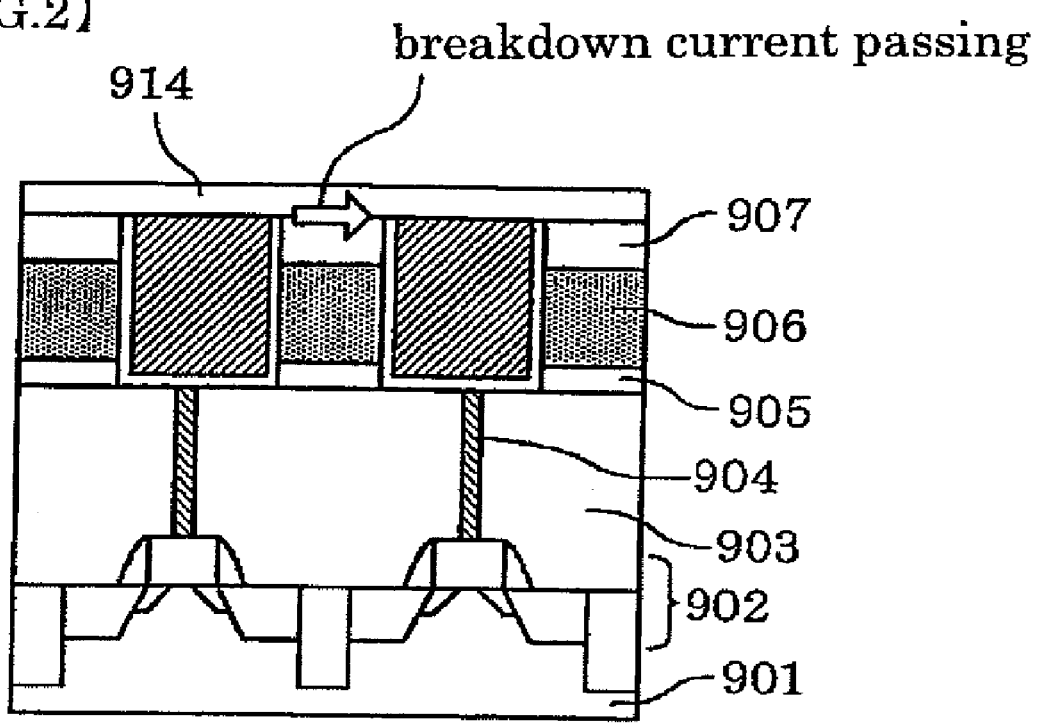

[FIG.3]
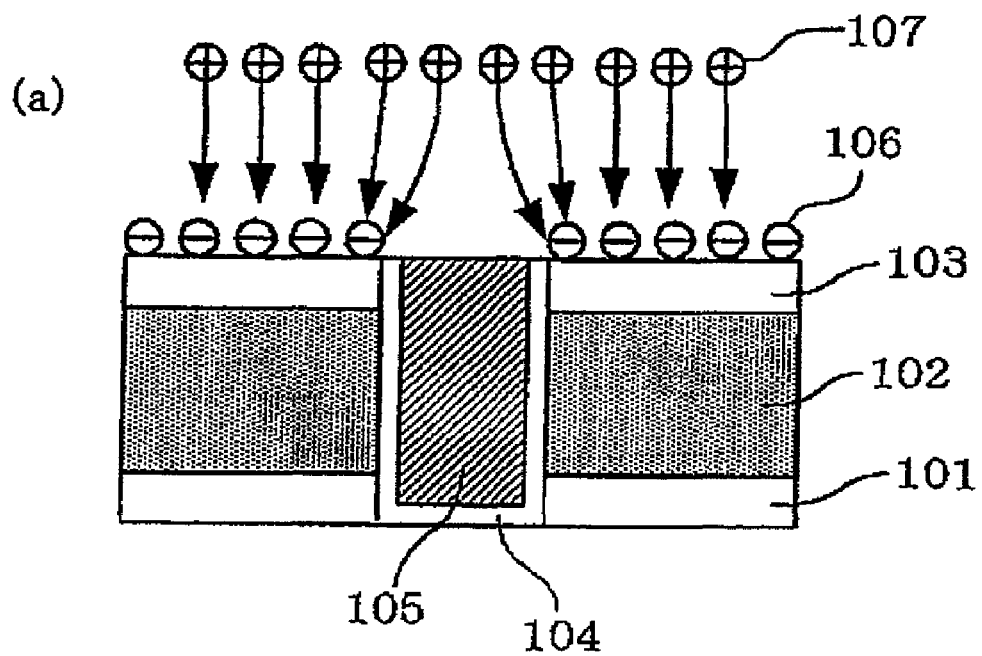
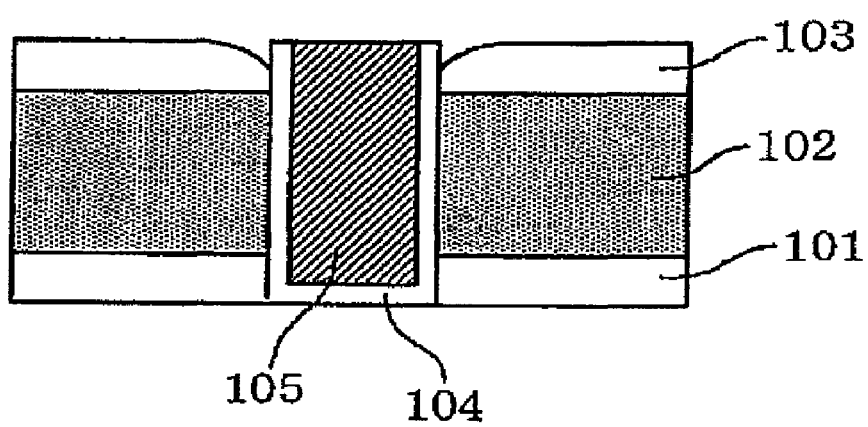

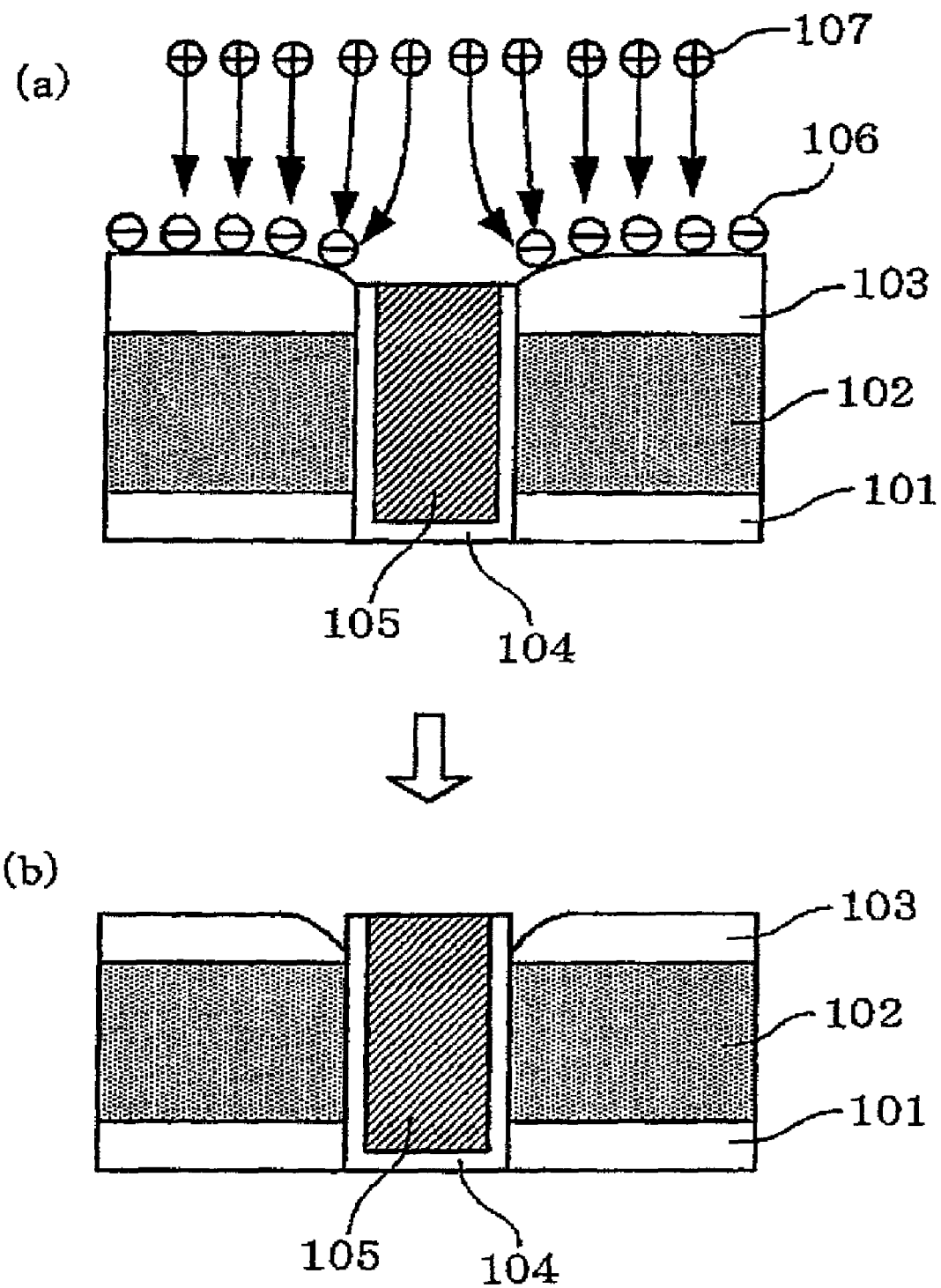
[FIG.4]

[FIG.5]
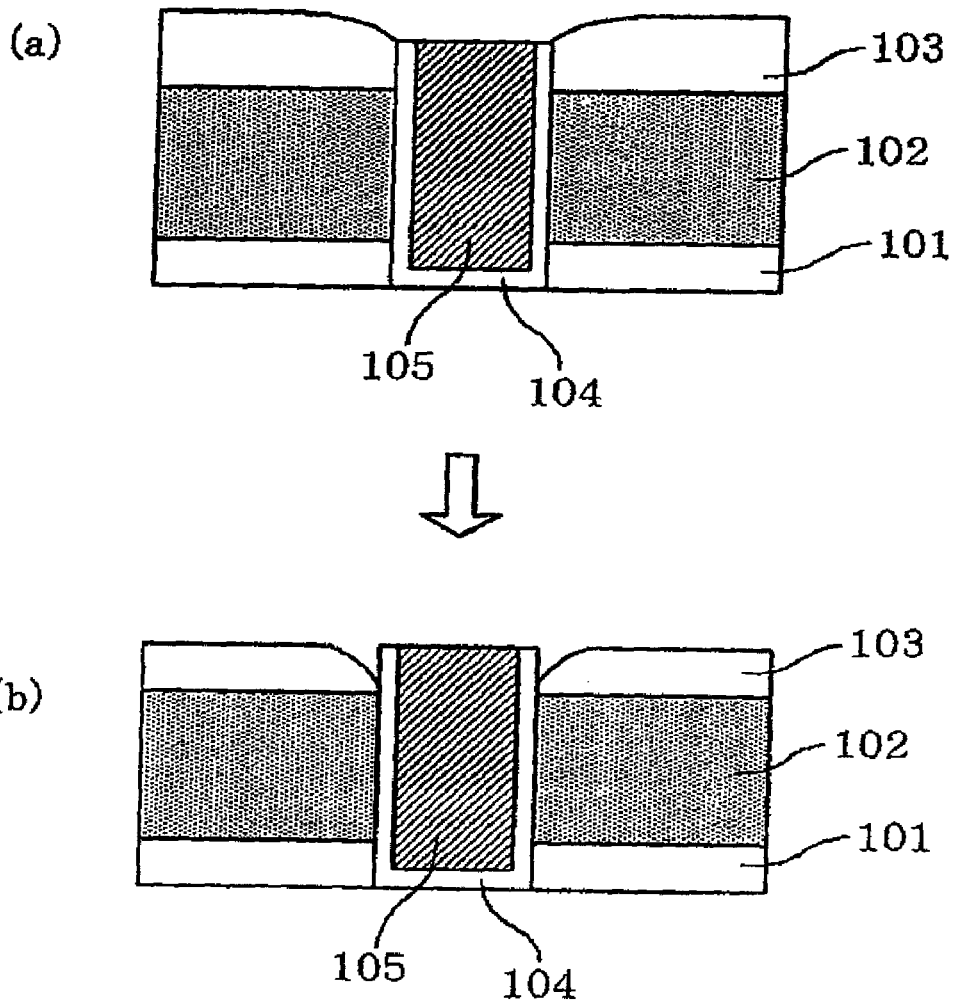

[FIG.6A]
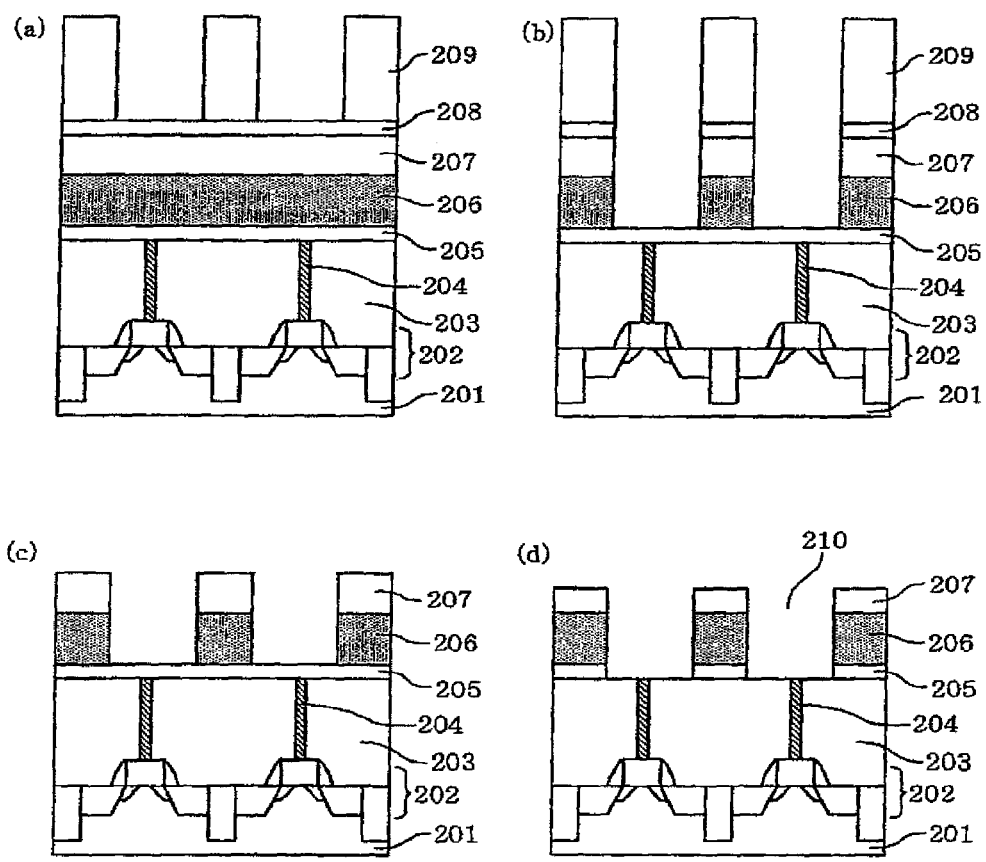

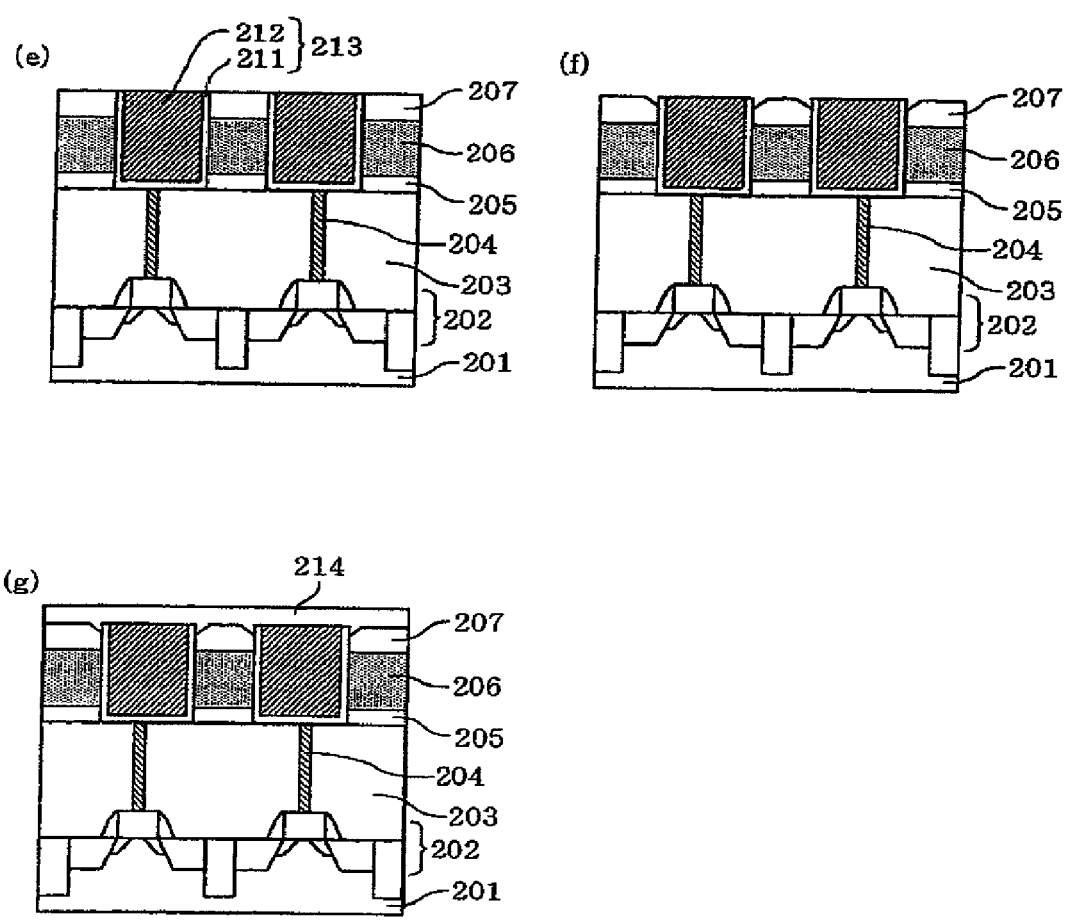
[FIG.6B]

[FIG.7A]
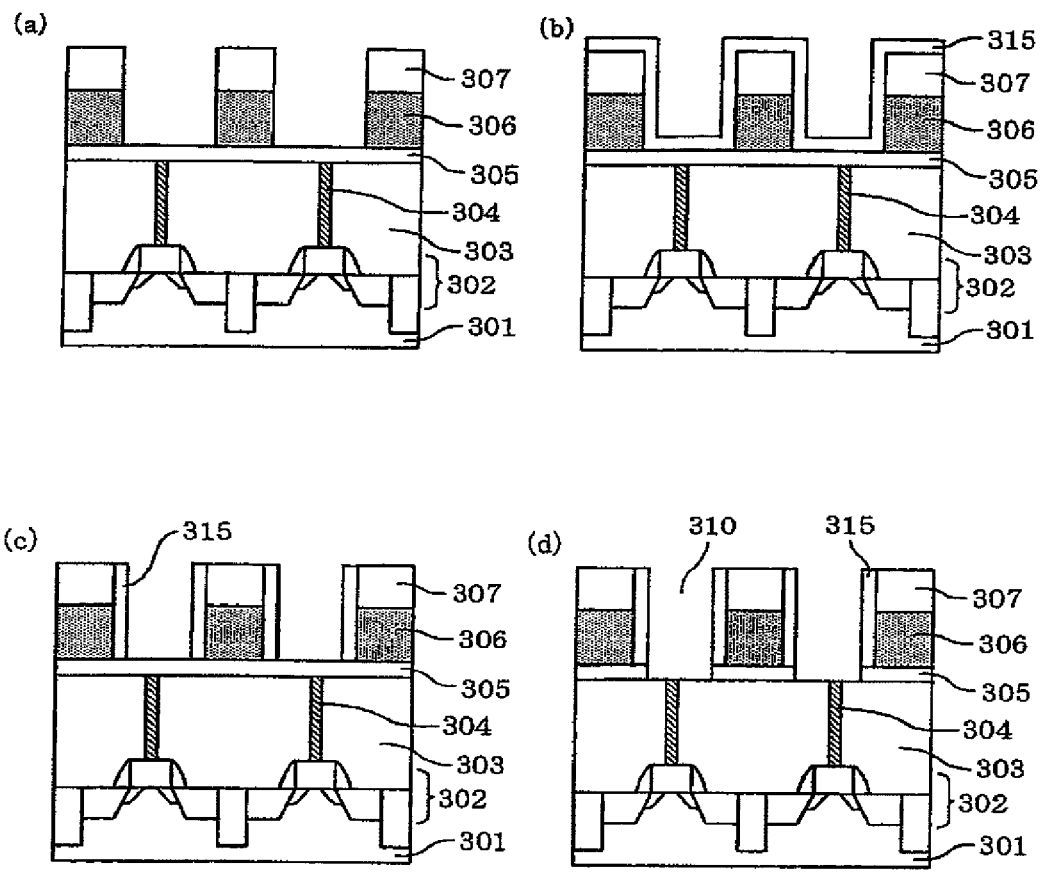

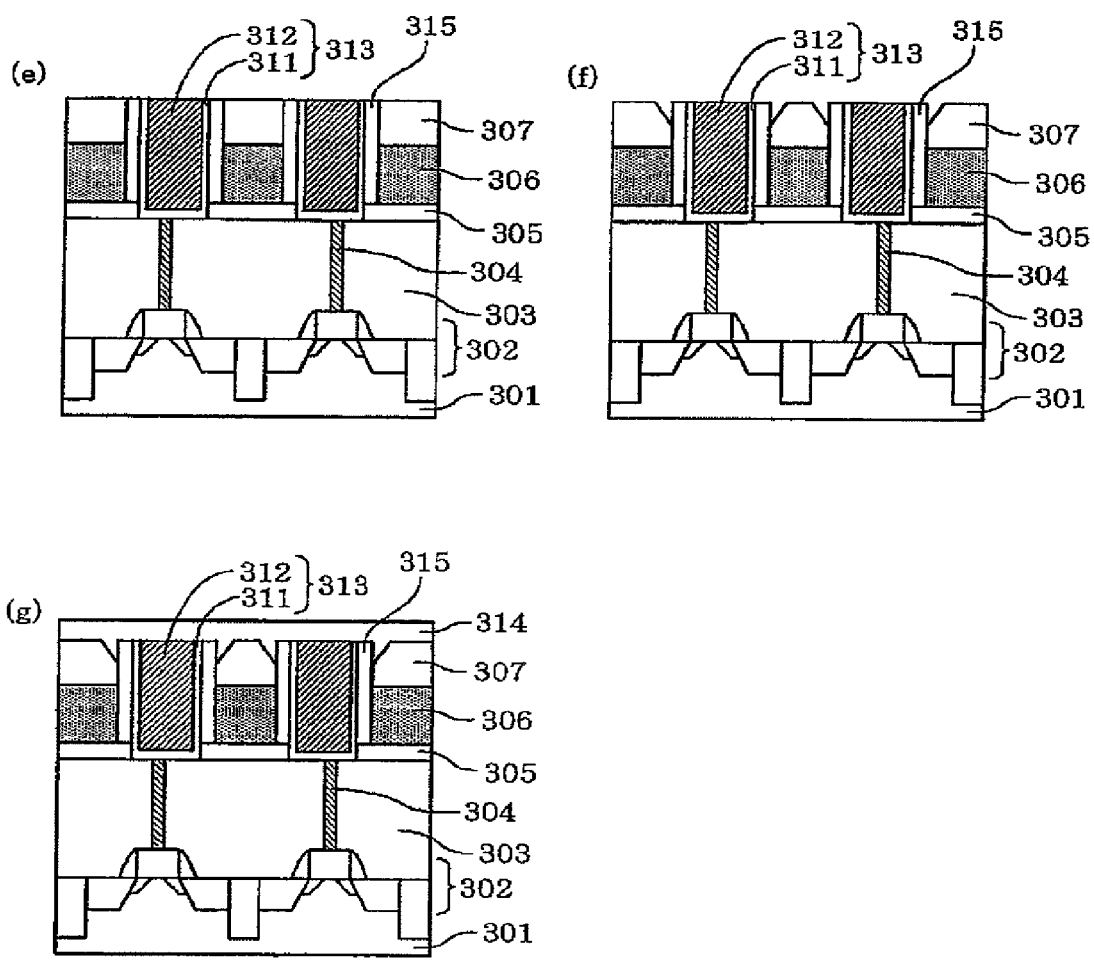
[FIG.7B]

[FIG.8A]
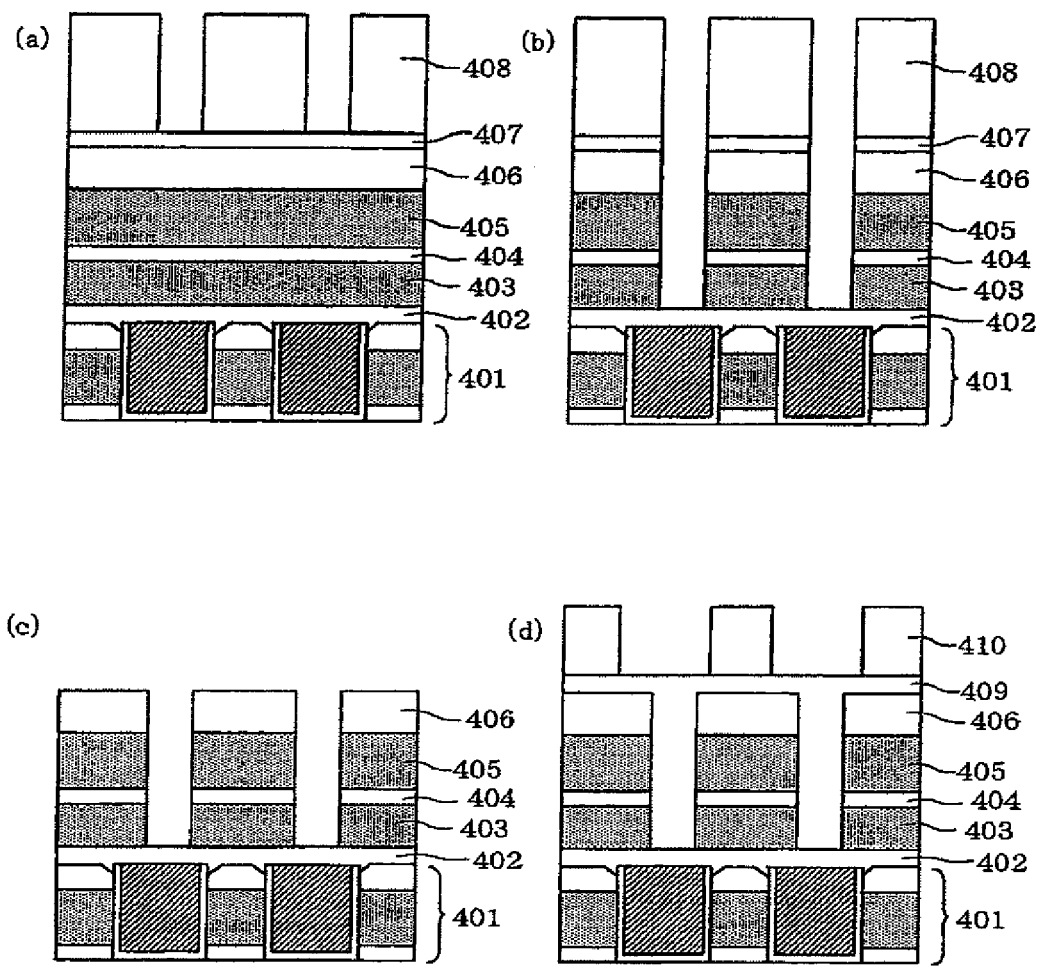

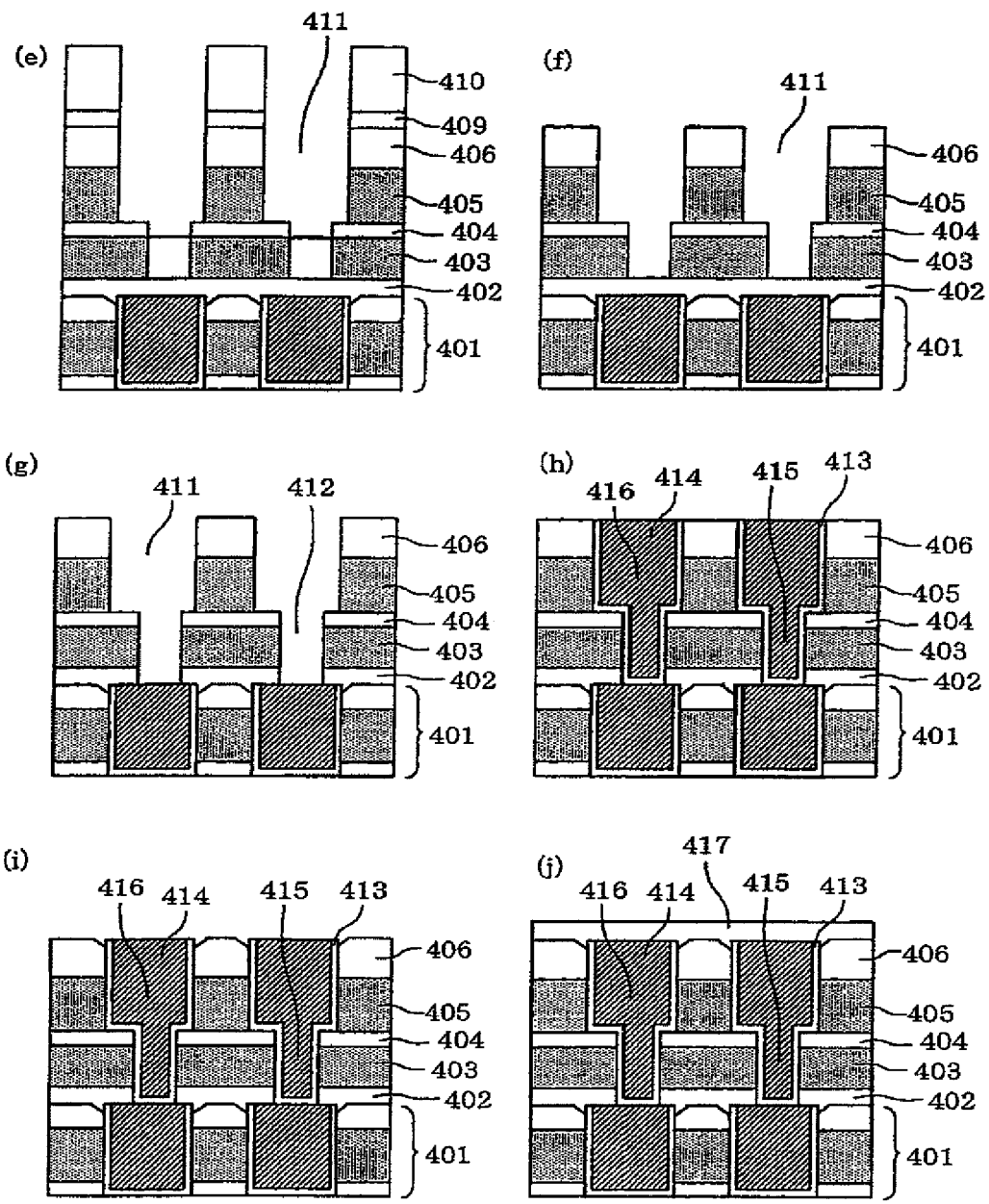
[FIG.8B]

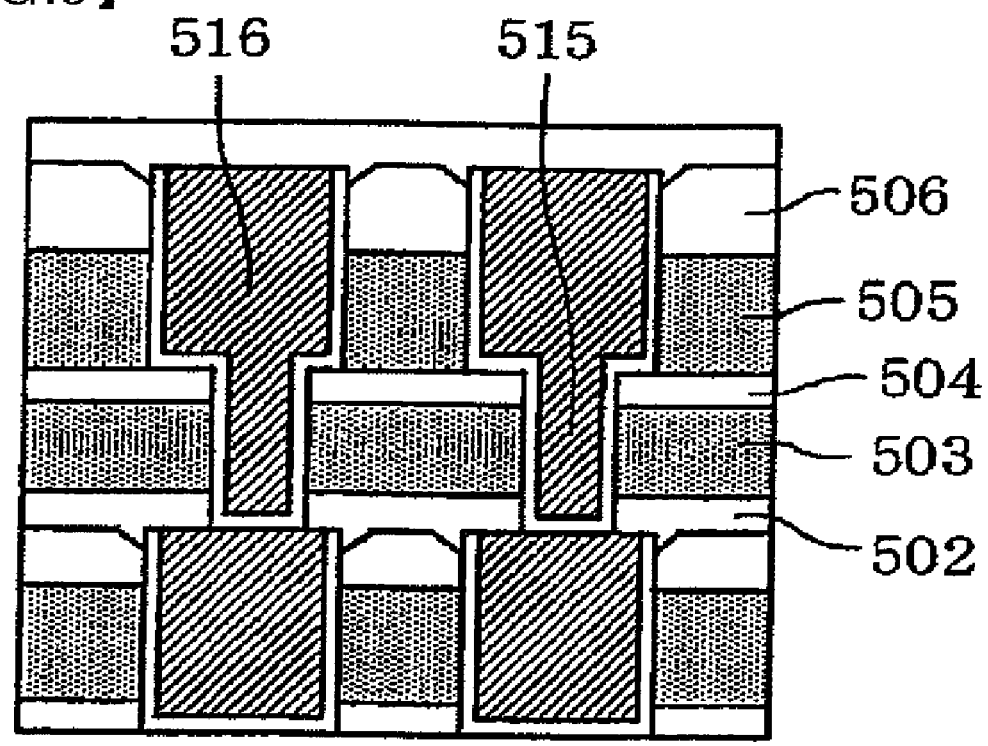
[FIG.9]

[FIG.10]
(a)
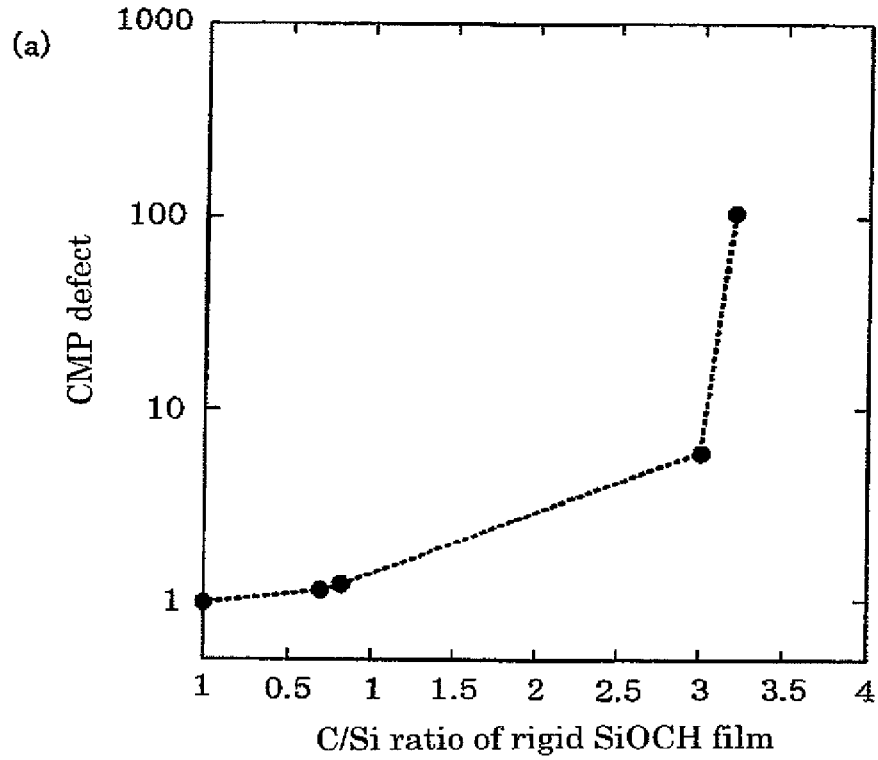
(b)
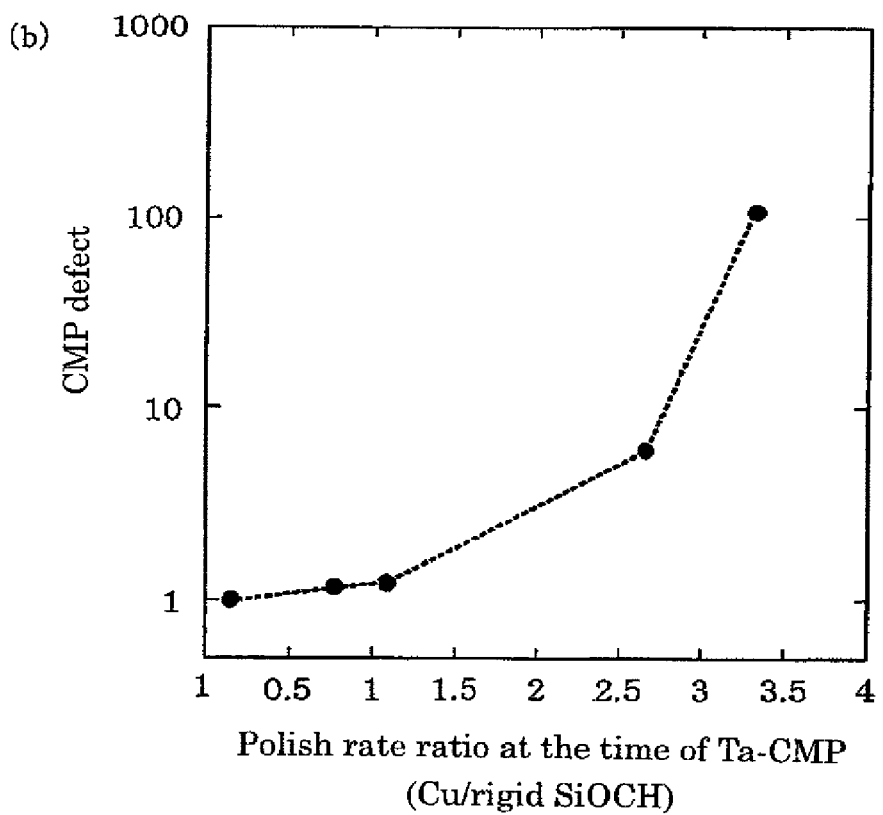

[FIG.11]
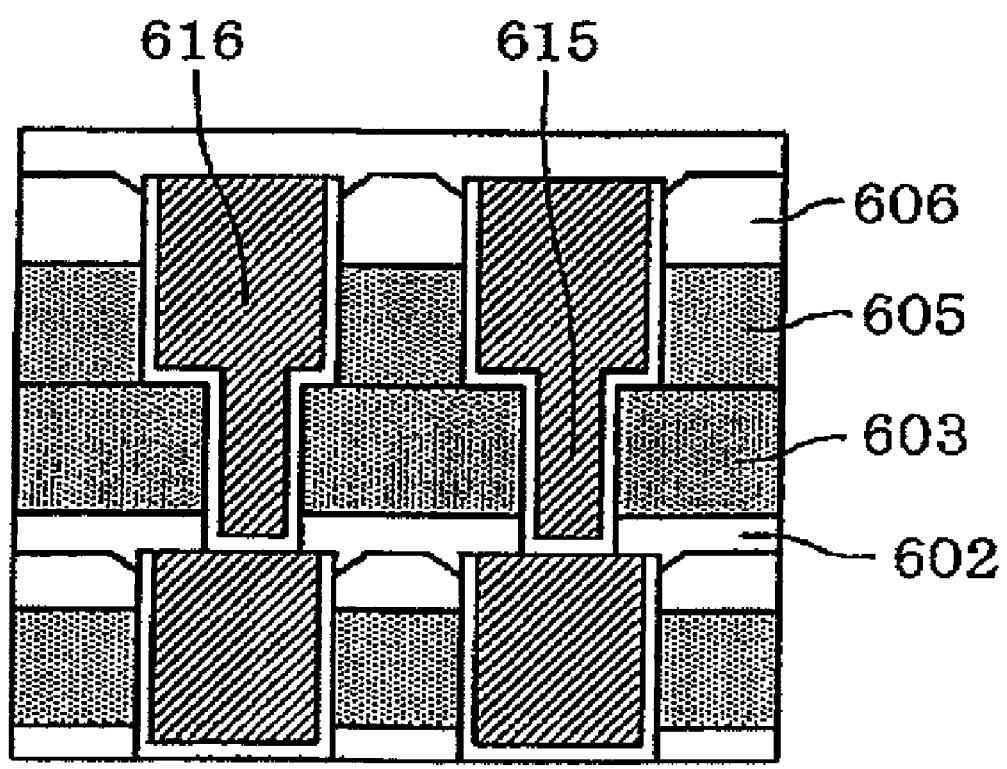

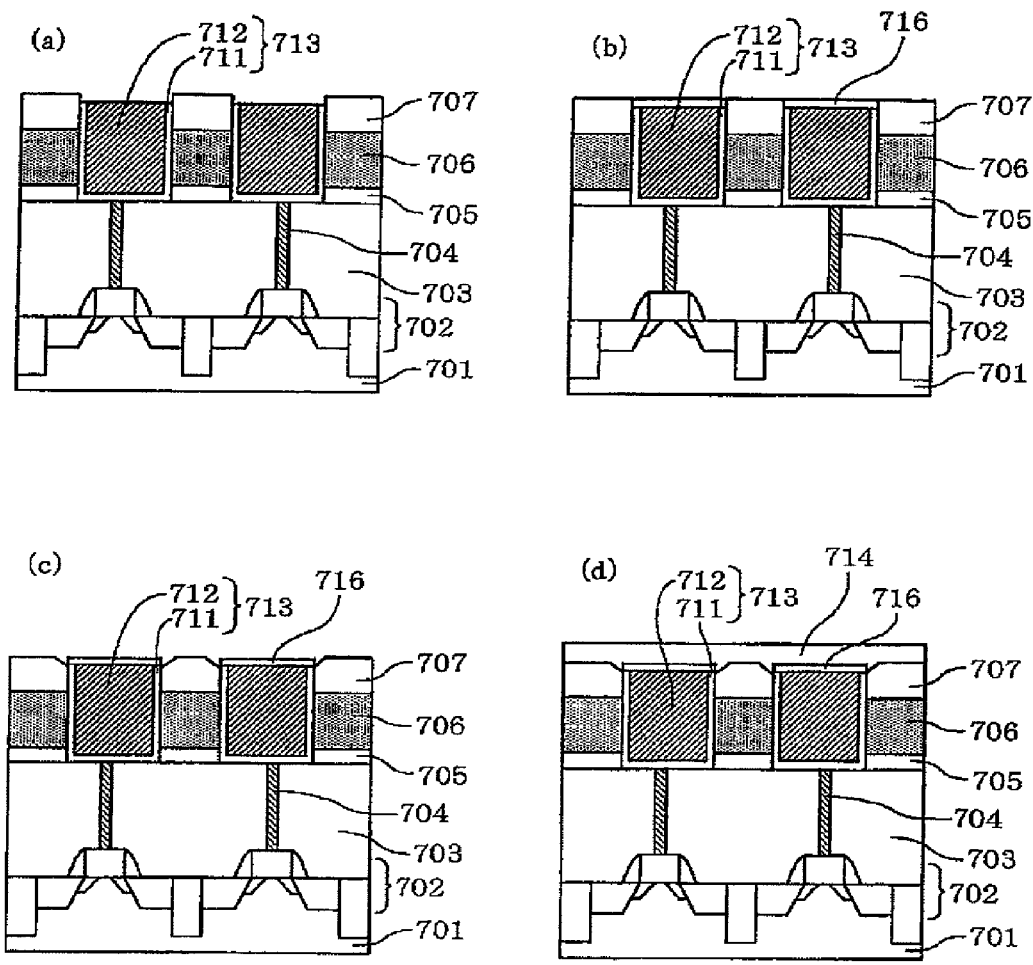
[FIG.12]

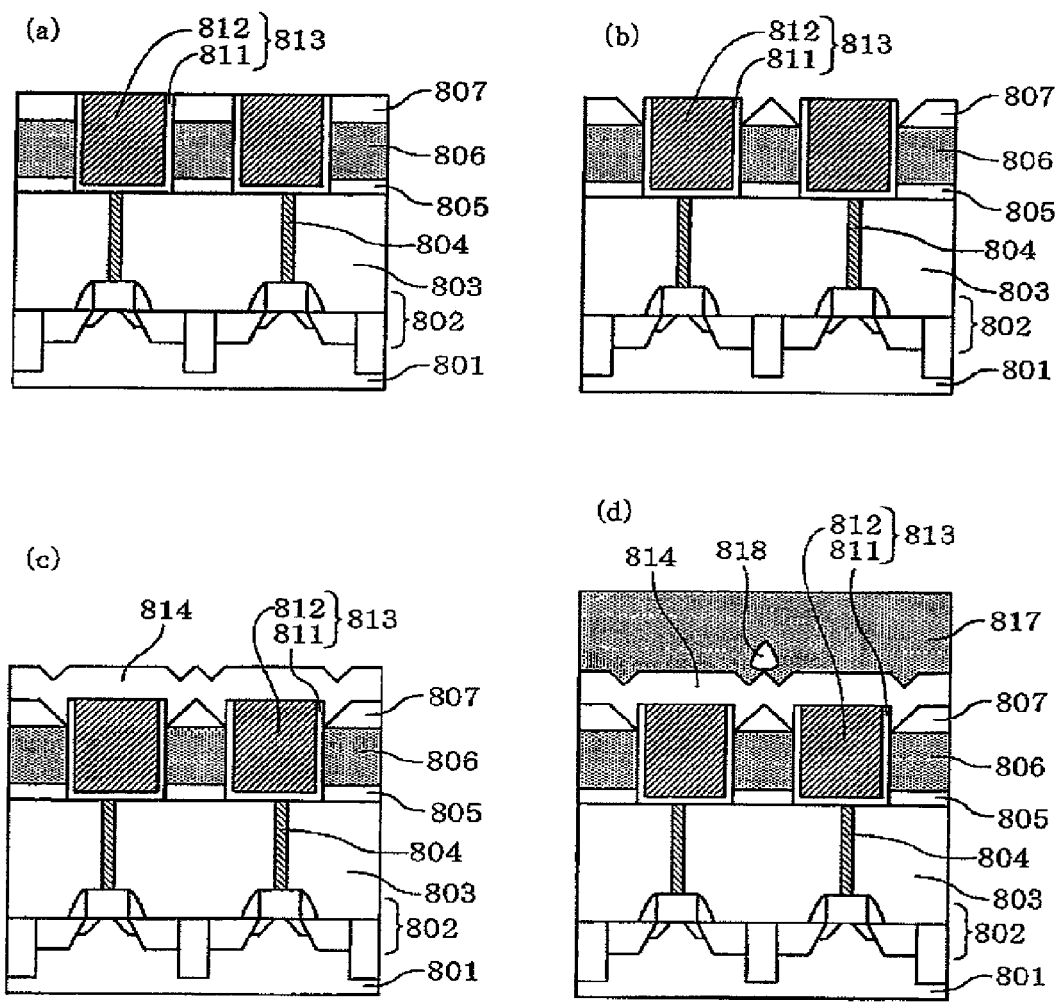

MULTILAYERED WIRING STRUCTURE, AND METHOD FOR MANUFACTURING MULTILAYERED WIRING

BACKGROUND OF THE INVENTION

1. Field of the Invention

This is the National Stage entry of PCT/JP2007/052056 filed on Feb. 6, 2007 which claims priority from Japanese Patent Application No. 2006-027886, filed on Aug. 16, 2007.

The present invention relates to a multilayered wiring structure and a method for manufacturing a multilayered wiring and, more particularly, to a method for manufacturing a multilayered wiring structure and a multilayered wiring having a trench wiring called Damascene structure.

2. Description of the Related Art

Aiming to more sufficiently describe the current technical level relating to the present invention, all of the patents, patent applications, patent publications, scientific articles and so on, which are cited or specified herein, are hereby incorporated by reference in their entirety.

Recent VLSI devices require more than millions of elements to be integrated in a chip of several millimeters square, and thus, it is essential to miniaturize the elements and to manufacture miniaturized and a multilayered wiring. Here, particularly for faster operational velocity of the device, reduction in wiring resistance and interlayer capacitance is a problem of key importance.

For reduction in wiring resistance and interlayer capacitance, a method is used in which copper is employed as a wiring material, and in which a film lower in dielectric constant than a silicon oxide film is employed as an interlayer insulation film Copper wiring is a most-watched material as a next generation of wiring material for its low resistance and high reliability. However, unlike conventional metal materials, fabrication of copper by dry etching is difficult, and hence, an embedded wiring technology (Damascene method) is conducted. Further, in order to achieve lower interlayer capacitance, a low-k dielectric constant film containing a pore is proposed as a wiring interlayer film. An example of the method for forming low-k dielectric constant film/copper wiring includes a manufacturing method as illustrated in FIG. 12.

First, a MOS transistor 902 is formed on a semiconductor substrate such as a silicon substrate 901; a silicon oxide film 903 is formed as an interlayer insulation film to cover the transistor portion; and then a contact plug 904 that connects the transistor and the wiring portion is formed using tungsten, for example. Next, a silicon carbide-nitride film 905 is formed by means of the CVD method as an etching stopper that prevents the interlayer insulation film from being etched from the upper layers. Further, a porous SiOCH film 906 is formed on the silicon carbide-nitride film 905 by means of, for example, the CVD method as an interlayer insulation film. Here, the typically used porous SiOCH films have a relative dielectric constant of 2.7 or less. Further, a silicon oxide film 907 is formed as a cap layer for the porous SiOCH film. Next, an antireflection film 908 and a resist film 909 are formed on the silicon oxide film 907, so that an opening trench is formed on the resist film by means of the photolithography technique and so on [FIG. 1(a)]. The antireflection film 908, the silicon oxide film 907 and the porous SiOCH film 906 are etched, using the resist film 909 as a mask [FIG. 1(b)], and the resist mask and the antireflection film are removed [FIG. 1(c)]. Subsequently, a silicon carbide-nitride film 905, which is an etching stopper, is etched [FIG. 1(d)]; and a wiring trench 910 is formed to be in contact with the contact plug 904. Then, a bather layer 911 comprising Ta is formed by means of the sputtering method, and further, a copper layer 912 is formed by means of, for example, the sputtering method and the plating method so that the copper layer 912 will be embedded in the wiring trench 910, and the unnecessary portion of the bather and copper layers 911 and 912 is polished and removed by means of the chemical mechanical polishing method (CMP method) whereby a trench wiring 913 is formed [FIG. 1(e)]. Further, a silicon carbide-nitride film 914 is formed as a cap film that inhibits diffusion of copper [FIG. 1(f)]. Then, a required number of layers comprising an interlayer insulation film, a conductive plug and a trench wiring are formed to provide a multilayered wiring.

It is well recognized that in the conventional structure fabricated by means of the above-described process called Damascene manufacturing method, the shorter the interwiring distance is due to the miniaturization, the lower the interwiring insulation is. It is reported that, for example, in the TDDB (Time Dependent Dielectric Breakdown) test in which a voltage is applied to the interwiring to measure the time until the dielectric breakdown occurs, the smaller the size is, the shorter the time until the dielectric breakdown becomes. This requires a technology for ensuring insulation in spite of the smaller size, and hence, several methods are proposed.

The main cause of the TDDB defect is that as shown in FIG. 2, a leakage current passes through the insulation film interface placed at the same height as the Cu-polished surface, and that thereby a short circuit occurs. To inhibit the defect, methods for lowering the height of the insulation film interface with respect to the Cu-polished surface are proposed (For example, see Patent Documents 1 to 3). For example, Patent Document 1 discloses a method in which a silicon nitride film is formed on the interlayer insulation film, and Cu is embedded in a trench that extends through the interlayer insulation film and the silicon nitride film, and then the wiring is polished so that the silicon nitride film is removed by means of dry etching or wet etching. In addition, Patent Document 2 discloses a method in which a Cu wiring is formed in the interlayer insulation film, and then a portion of the interlayer insulation film is removed by means of dry etching or wet etching. Further, Patent Document 3 discloses a method in which a Cu wiring is formed between the interlayer insulation films, and then the surface of an interlayer insulation film is abraded by dry plasma treatment prior to formation of a cap film.

[Patent Document 1] Japanese Laid-open Patent Publication No. 2000-77519

[Patent Document 2] Japanese Laid-open Patent Publication No. 2000-323479

[Patent Document 3] Japanese Laid-open Patent Publication No. 2003-124311

SUMMARY OF THE INVENTION

As in the conventional technology described in the above-mentioned Patent Documents, when the height of the insulation film interface is lower with respect to the Cu-polished surface, the TDDB withstand voltage improves. However, if there is a level difference, the focus margin during the exposure for forming a via hole on the upper insulation film is degraded, and thus, planarization by polishing the insulation film is essentially required. It is likely that planarization would not only increase the number of fabrication processes, but also change the etching depth of the via hole, affecting the yield rate in forming a via hole.

The task of the present invention is to solve the above-mentioned problems involved in the conventional technologies, and it is an object of the present invention to provide a multilayered wiring structure having a superb TDDB withstand voltage, and to allow formation of a planar insulation film on a Damascene wiring without conducting any planarization CMP.

In order to achieve the above-mentioned object, the present invention provides with a multilayered wiring structure which is a wiring structure comprising: a first insulation film; a wiring trench formed on the first insulation film; and a wiring embedded in the wiring trench, wherein the multilayered wiring structure is provided with: an interwiring central region of the first insulation film the top surface of which is arranged to be at the height generally equal to the height of the top surface of the wiring; and a peripheral region of the wiring of the first insulation film the top surface of which is arranged to be at the height lower than the top surface of the wiring.

Further, in order to achieve the above-mentioned object, the present invention provides with a method for manufacturing a multilayered wiring, comprising the steps of: (1) forming a first insulation film; (2) forming a wiring trench on the first insulation film; (3) forming a conductive layer to embed the wiring trench; (4) removing the conductive layer on the first insulation film to form a wiring of a desired pattern; and (5) etching the surface of the first insulation film, wherein the multilayered wiring is fabricated in such a manner that the wiring protrudes from the surface of the first insulation film, and that the top surface of the first insulation film at the interwiring central region has generally the same height as the top surface of the wiring.

Further, in order to achieve the above-mentioned object, the present invention provides with a method for manufacturing a multilayered wiring, comprising the steps of: (1) forming the first and second insulation films so that the first insulation film will be upper; (2) forming a wiring trench on the first insulation film and a via hole on the second insulation film, respectively; (3) forming a conductive layer to embed the via hole and the wiring trench; (4) removing the conductive layer formed on the first insulation film to form a wiring of a desired pattern, with the wiring being connected to the conductive plug embedded in the via hole; and (5) etching the surface of the first insulation film, wherein the multilayered wiring is fabricated in such a manner that the wiring protrudes from the surface of the first insulation film, and that the top surface of the first insulation film at the interwiring central region has generally the same height as the top surface of the wiring.

Further, in order to achieve the above-mentioned object, the present invention provides with a semiconductor device having a multilayered wiring structure which is a wiring structure comprising: a first insulation film; a wiring trench formed on the first insulation film; and a wiring embedded in the wiring trench, wherein the multilayered wiring structure is provided with: an interwiring central region of the first insulation film the top surface of which is arranged to be at the height generally equal to the height of the top surface of the wiring; and a peripheral region of the wiring of the first insulation film the top surface of which is arranged to be at the height lower than the top surface of the wiring.

According to the present invention, the part of the surface of the interlayer insulation film in which an embedded wiring is formed is made higher at the central region of the interwiring and lower at the region adjacent to the wiring. Accordingly, the creepage distance between the wirings increases and thus the TDDB withstand voltage improves. At the same time, the top surface of the interlayer insulation film on which a wiring trench is formed is placed generally as high as the top surface of the trench wiring, and thus, an insulation film with a planar surface can be formed thereon. Hence, according to the present invention, degradation of the focus margin can be prevented and without conducting CMP planarization, and reduction in the yield rate of the via hole formation due to the CMP planarization can be avoided.

BRIEF DESCRIPTION OF THE DRAWINGS

FIG. 1 is a vertical cross-sectional view showing the method for manufacturing a conventional multilayered wiring based on the Damascene process in the process sequence. In FIG. 1(a), an opening trench is formed on the resist film. In FIG. 1(b), a silicon oxide film 907 and a porous SiOCH film 906 are etched. In FIG. 1(c), the resist film and the antireflection film are removed. In FIG. 1(d), a silicon carbide-nitride film 905 is etched. In FIG. 1(e), a trench wiring 913 is formed. In FIG. 1(f), a silicon carbide-nitride film 914 is formed.

FIG. 2 is a view showing the current path at the time of TDDB defect.

FIG. 3 is a vertical cross-sectional view schematically showing the first level difference formation processes according to the present invention by means of dry etching. FIG. 3(a) is a vertical cross-sectional view showing a condition in which dry etching is provided. FIG. 3(b) is a vertical cross-sectional view showing that the surface height of the peripheral portion of the insulation film adjacent to the wiring is lower than that of the interwiring.

FIG. 4 is a vertical cross-sectional view schematically showing the second level difference formation processes according to the present invention by means of dry etching. FIG. 4(a) is a vertical cross-sectional view showing a condition in which dry etching is provided. FIG. 4(b) shows the surface height of the insulation film adjacent to the wiring.

FIG. 5 is a sectional view schematically showing the level difference formation processes by means of wet etching according to the present invention. FIG. 5(a) is a vertical cross-sectional view showing a condition in which wet etching is provided on the semiconductor substrate. FIG. 5(b) is a configuration diagram showing that the surface height of the insulation film adjacent to the wiring is arranged to be lower than that of the interlayer insulation film in the interwiring.

FIG. 6A is a vertical cross-sectional view showing the method for manufacturing a multilayered wiring according to Embodiment 1 of the present invention in the process sequence. In FIG. 6A(a), an opening trench is formed. In FIG. 6A(b), an antireflection film 208, a silicon oxide film 207 and a porous SiOCH film 206 are etched. In FIG. 6A(c), a resist film 209 and the antireflection film 208 are removed. In FIG. 6A(d), a wiring trench 210 that is open to the contact plug 204 is formed.

FIG. 6B is a vertical cross-sectional view showing the method for manufacturing a multilayered wiring according to Embodiment 1 of the present invention in the process sequence. Subsequent to FIG. 6A, in FIG. 6B(e), a trench wiring 213 is formed consisting of a barrier layer 211 and a copper layer 212. In FIG. 6B(f), a portion adjacent to the wiring of the polished surface of the silicon oxide film 207 is etched. In FIG. 6B(g), a silicon carbide-nitride film (SiCN) 214 is formed by means of the CVD method.

FIG. 7A is a vertical cross-sectional view showing the method for manufacturing a multilayered wiring according to Embodiment 2 of the present invention in the process sequence. In FIG. 7A(a), a trench is formed on a silicon oxide film 307 and a porous SiOCH film 306 in which a wiring is embedded. In FIG. 7A(b), an organic macromolecule film 315 is formed on the silicon oxide film 307 that contains the trench inner wall surface by means of the CVD method and so on. In FIG. 7A(c), the porous SiOCH film 306 is sealed, with an organic macromolecule film 315 remaining only on the trench side surface. In FIG. 7A(d), an opening wiring trench 310 that is open to the contact plug 304 is formed.

FIG. 7B is a vertical cross-sectional view showing the method for manufacturing a multilayered wiring according to Embodiment 2 of the present invention in the process sequence. Subsequent to FIG. 7,', in FIG. 7B. (e), a trench wiring 213 is formed consisting of a barrier layer 211 and a copper layer 212. In FIG. 7B(f), a portion adjacent to the wiring of the polished surface of the silicon oxide film 207 is etched. In FIG. 7B(g), a silicon carbide-nitride film (SiCN) 214 is formed by means of the CVD method.

FIG. 8A is a vertical cross-sectional view showing the method for manufacturing a multilayered wiring according to Embodiment 3 of the present invention in the process sequence. In FIG. 8A(a), a via-hole-opening resist pattern is formed on the resist film 408 by means of the photolithography technique. In FIG. 8A(b), etching of the SiOCH film 403 is stopped at the silicon carbide-nitride film 402 as a Cu cap film. In FIG. 8A(c), the resist film 408 and the antireflection film 407 are removed. In FIG. 8A(d), a resist pattern for the wiring trench is formed on the resist film 410 by means of the photolithography technique.

FIG. 8B is a vertical cross-sectional view showing the method for manufacturing a multilayered wiring according to Embodiment 3 of the present invention in the process sequence. Subsequent to FIG. 8A, in FIG. 8B(e), the antireflection film 409, the silicon oxide film 406 and the porous SiOCH film 405 beneath the resist pattern french are etched in series to form a wiring trench 411. In FIG. 8B(f), the resist film 410 is removed by ashing so that the antireflection film 409 is removed. In FIG. 8B(g), a via hole 412 is formed so that the Dual Damascene structure is formed. In FIG. 8B(h), a trench wiring capped with a silicon carbide-nitride film 417 is formed. In FIG. 8B(i), an etching for antireflection is conducted. In FIG. 8B(j), a silicon oxide film is formed.

FIG. 9 is a vertical cross-sectional view showing the first modification to Embodiment 3 of the present invention.

FIG. 10 is a graph for explaining the modification showing Embodiment 3 of the present invention. FIG. 10(a) is a graph showing the carbon/silicon ratio of a silicon carbide-nitride film 602, a porous SiOCH film 603, a porous SiOCH film 605 and a rigid SiOCH film 606. Similarly, FIG. 10(b) is a graph showing the polishing rate ratio at the time of Ta-CMP.

FIG. 11 is a vertical cross-sectional view showing the second modification to Embodiment 3 of the present invention.

FIG. 12 is a vertical cross-sectional view showing the method for manufacturing a multilayered wiring according to Embodiment 4 of the present invention in the process sequence. In FIG. 12(a), a trench wiring is formed in an interlayer insulation film. In FIG. 12(b), a CoWP film 716 as a metal cap film is selectively made to grow only on the trench wiring 713. In FIG. 12(c), a portion adjacent to the wiring of the polished surface of the silicon oxide film is etched by means of dry etching or wet etching. In FIG. 12(d), a silicon carbide-nitride film 714 is formed as a Cu cap film by means of the CVD method, for example.

FIG. 13 is a vertical cross-sectional view showing the method for manufacturing a multilayered wiring according to Embodiment 5 of the present invention in the process sequence. In FIG. 13(a), a trench wiring is formed in the interlayer insulation film. In FIG. 13(b), a portion adjacent to the wiring of the polished surface of the silicon oxide film is etched. In FIG. 13(c), a silicon carbide-nitride film 814 is formed by means of the CVD method. In FIG. 13(d), a SiOCH film 817, for example, is formed as a via hole interlayer film.

DETAILED DESCRIPTION OF THE INVENTION

The main features of the inventive multilayered wiring structure and the inventive method for manufacturing multilayered wiring are the chemical mechanical polishing (CMP) for embedding a wiring in a wiring trench; and the subsequent etching treatment to the surface of the interlayer insulation film. First of all, these processes will be described.

FIG. 3(a) is a sectional view showing the condition in which dry etching is provided to a CMP-treated semiconductor substrate according to the present invention. In the wiring trench formed as an interlayer insulation film composed of an etching stopper film 101, a low-k dielectric constant insulation film 102 and a cap layer 103 is embedded a wiring composed of a barrier layer 104 and a copper layer 105. As a result of CMP, the surface of the interlayer insulation film and of the wiring is made planar. In the course of dry etching, electrons 106 are charged up on the surface of the interlayer insulation film which is an insulator, while no electron is accumulated on the wiring. Accordingly, the electrode potential is lower on the surface of the interlayer insulation film (the cap layer surface) than on the surface of the wiring. Hence, ions 107 accelerated by the sheath electrode potential pass onto the surface of the cap layer having lower electrode potential, whereby more number of ions converge around the wiring. Accordingly, as indicated in FIG. 3(b), the surface height of the peripheral portion of the insulation film adjacent to the wiring is made lower than that of the insulation film on the interwiring. In the etching treatment, the insulation film on the interwiring can be barely etched by selecting the etching conditions; and in that case, the surface height of the insulation film on the interwiring is generally equal to the surface height of the wiring.

FIG. 4(a) is a sectional view showing the condition in which dry etching is provided to a CMP-treated semiconductor substrate. The surface height of the wiring is made lower than that of the interlayer insulation film by adjusting the treatment conditions during the CMP process. Starting the dry etching in this particular condition, as described above, the region adjacent to the wiring is preferentially etched. Hence, as shown in FIG. 4(b), the surface height of the insulation film adjacent to the wiring can be made lower than in FIG. 3.

FIG. 5(a) is a sectional view showing a condition in which wet etching is provided on the CMP-treated semiconductor substrate. In this case, too, the surface height of the wiring is made lower than that of the interlayer insulation film by adjusting the treatment conditions during the CMP process. Starting the etching using a dilute fluorinated acid, for example, the etching develops isotropically. Hence, if an etching is carried out in such a manner that the surface height of the interlayer insulation film becomes equal to that of the wiring, then the interlayer insulation film adjacent to the wiring comes in contact with the side of the wiring, and thus, the surface height of the insulation film adjacent to the wiring can be made lower than that of the interlayer insulation film on the interwiring (FIG. 5(b)).

Hereinafter, the embodiments of the present invention will be described in detail with reference to the drawings.

Embodiment 1

<Basic Structure (Single Damascene)>

FIGS. 6A(a) to 6B(g) are sectional views that schematically illustrate each manufacturing process of the multilayered wiring structure according to Embodiment 1 of the present invention in the process sequence. In Embodiment 1, a Cu wiring is formed in the trench of the silicon oxide film/porous SiOCH film/silicon carbide-nitride film, and some part of the silicon oxide film is removed so that TDDB withstand voltage will improve. First, a MOS transistor 202, for example, is formed on the silicon substrate 201, and a silicon oxide film 203, for example, is formed as an interlayer insulation film to cover the transistor portion, so that a contact plug 204 that connects the transistor and the wiring portion is formed using tungsten, for example. Next, a silicon carbide-nitride film 205 is formed by means of, for example, the CVD method as an etching stopper of the interlayer insulation film. Further, a porous SiOCH film 206 is formed on the silicon carbide-nitride film 205 as a low-k dielectric constant insulation film by means of, for example, the CVD method. In addition, a silicon oxide film 207 is made to grow on the porous SiOCH film 206 so that the silicon oxide film 207 will be a low-k dielectric constant film cap layer. Next, an antireflection film 208 and a resist film 209 are formed on the silicon oxide film 207 to form an opening trench on the resist film 209 by means of the photolithography technology [FIG. 6A(a)]. Using the resist film 209 as a mask, the antireflection film 208/silicon oxide film 207/porous SiOCH film 206 are etched [FIG. 6A(b)], and then the resist film 209 and the antireflection film 208 are removed [FIG. 6A(c)]. Further, the silicon carbide-nitride film 205 is etched back, and a wiring trench 210 that is open to the contact plug 204 is formed [FIG. 6A(d)]. Next, Ta and copper, for example, which will form the barrier layer 211 are laminated by means of the sputtering method, and then, copper is laminated by means of, for example, the plating method to embed the wiring trench 210. Further, the unnecessary portion of the barrier and copper layers 211 and 212 is polished and removed by means of the CMP method, whereby a trench wiring 213 composed of the barrier and copper layers 211 and 212 is formed [FIG. 6B(e)]. In addition, washing is conducted, and optionally, an anticorrosive is applied such as BTA (benzotriazole) in order to prevent Cu corrosion. Then, as shown in FIGS. 1 to 3, dry wetting or wet etching is carried out so that a portion of the polished surface of the silicon oxide film 207 adjacent to the wiring will be etched [FIG. 6B(f)]. The level difference is, for example, around 1 nm to 100 nm, preferably 50 nm or less. This is because insufficiency in etching amount would result in insufficient improvement in reliability, while excessiveness in etching amount would result in inhibition of formation of a Cu cap film. Further, the level difference between the top surface of the copper layer 212 and the top surface of the silicon oxide film 207 is preferably within the range of 50 nm or less, and more preferably, within the range of 25 nm or less. Here, the top surface height of the interwiring central region of the silicon oxide film 207 is generally equal to that of the copper layer 212 with the above-mentioned accuracy. On the other hand, the top surface of the peripheral portion of the wiring of the silicon oxide film 207 is etched so that the height of the portion is made lower than that of the copper layer 212. After the CMP, the Cu anticorrosive applied in the final process of washing is removed by the etching treatment. Hence, after the etching treatment is conducted, an anticorrosive is applied to the surface of the Cu wiring so that the surface will be coated with the anticorrosive. The anticorrosive prevents oxidation of the Cu wiring.

Further, a silicon carbide-nitride film (SiCN) 214 is formed as a Cu cap film by means of, for example, the CVD method [FIG. 6B(g)]. Examples of the Cu cap film may include an organic film formed by means of the silicon carbonization film (SiC) or the plasma polymerization method, and a siloxane-containing organic film such as Divinyl-siloxane-bis-benzocyclobutene (DVS-BCB). It is essentially important that prior to growth of the Cu cap film, the anticorrosive such as BTA that remains on the Cu surface should be removed. Exposing the substrate to the reducing atmosphere heated under the condition of decompression of 10 Torr (1333 Pa) or less and at 300° C. or higher enables removal of the anticorrosive that coats the surface of the Cu wiring. Examples of the condition of reducing atmosphere include irradiation of H2 gas, $SiH_4$ gas and $He/H_2$ gas, or irradiation of $H_2$ plasma, $H_2/He$ plasma and $NH_3$ plasma.

The feature of the semiconductor device according to the present invention is that the top surface of the Cu wiring is in a more convex shape than the silicon oxide film on the low-k dielectric constant film, and that thereby the Cu cap film (silicon carbide-nitride film 214) is formed not only on the top surface but also on a part of the side surface of the Cu wiring.

The method according to the present invention allows for improvement in TDDB withstand voltage by greater creepage distance of the interwiring. Besides, since a silicon oxide film is provided on the top surface, CMP can be carried out while adhesion is ensured between the barrier layer and the interlayer insulation film, whereby excellent CMP can be achieved. Further, since a silicon oxide film on the top surface, adhesion to the silicon carbide-nitride film which will form a Cu cap film can be ensured, resulting in the certainty of the processes and the reliability of the wirings. Still further, the top surface of the insulation film not in proximity of the wiring is flat and as high as the top surface of the Cu, and thus, planarization treatment of the upper insulation film is not required. Still more further, since the level difference is thus minimized and the exposure margin for opening a via hole increases, the reliability of the via hole formation also improves.

The present Embodiment showed a working example in which a silicon carbide-nitride film is used as an etching stopper. Nevertheless, any material can be used so long as the etching selectivity of the low-k dielectric constant film is ensured, such as silicon carbide, silicon nitride, silicon oxynitride or the like. In addition, any material can be used for the low-k dielectric constant film of the interlayer insulation film so long as it is of a low-k dielectric constant. Non-limiting examples of such materials include the CVD-SiOCH film such as Aurora series made by ASM JAPAN K.K., Orion made by Tricon, BD/BDII made by Applied Materials, Inc., and Coral made by Novellus Systems, Inc.; and the SiOCH-type coating film such as Porous SiLK made by Dow Chemical Company and NCS made by Catalysts & Chemicals Industries Co., Ltd. Further, the SiOCH film formed by plasma polymerization as described in the Japanese Laid-open Patent Publication No. 2004-047873 can be included in one of the examples. Still further, the present Embodiment showed an embodiment in which a silicon oxide film is used as a low-k dielectric constant film cap; however, any material can be used for the film so long as the film is dense enough to ensure the adhesion to such a film as will form a Cu cap or to a barrier film. Examples of such a material include silicon oxynitride, silicon nitride and silicon carbide.

Embodiment 2

<Pore Seal>

FIGS. 7A(a) to 7B(g) are sectional views that schematically illustrate each manufacturing process of the multilayered wiring structure according to Embodiment 2 of the present invention in the process sequence. In FIGS. 5A and 5B, the parts equivalent to those in FIGS. 6A and 6B that represent Embodiment 1 are assigned the reference numerals the last two digits of which are shared in common, and thus, the redundant descriptions will be properly omitted. In Embodiment 2, a Cu wiring is formed in the trench of the silicon oxide film/porous SiOCH film/silicon carbide-nitride film, and further, an organic macromolecule film is formed on the side surface of the wiring trench. In addition, similar to Embodiment 1, a part of the silicon oxide film is removed whereby TDDB reliability improves.

First, the processes similar to FIGS. 6A(a) to 6A(c) showing Embodiment 1 are taken to form a trench in the silicon oxide film 307 and the porous SiOCH film 306 in which to embed a wiring [FIG. 7A(a)]. Then, an organic macromolecule film 315 is formed on the silicon oxide film 307 having a trench inner wall surface by means of, for example, the CVD method and so on as described in Japanese Laid-open Patent Publication No. 11-17006 [FIG. 7A(b)], and an etching back is carried out, whereby the porous SiOCH film 306 is sealed, with the organic macromolecule film 315 remaining only on the trench side surface [FIG. 7A(c)]. Further, the silicon carbide-nitride film 305 is etched back, and then, an open wiring trench 310 that is open to the contact plug 304 is formed [FIG. 7A(d)]. Then, the processes similar to FIGS. 6B(e) to 6B(g) are taken to form a trench wiring that is capped with a silicon carbide-nitride film 314 [FIGS. 7B(e) to 7B(g)].

In comparison with Embodiment 1, the present Embodiment can inhibit the polished surface leakage, improve the reliability of the processes, as well as restrict the TDDB degradation caused by the leakage within the low-k dielectric constant film. Further, the adhesion between the interlayer insulation film and the wiring improves, leading to better reliability. In the present Embodiment, an organic macromolecule film was described as a material to seal the trench side surface; however, any material can be used so long as it is an insulation material formed by means of the CVD method. Examples of the material may include an inorganic material film such as silicon oxide film, silicon nitride film, silicon oxynitride film, silicon carbonization film and silicon carbide-nitride film, and a low-k dielectric constant film such as SiOCH.

Embodiment 3

<Dual Damascene>

FIGS. 8A(a) to 8B(j) are sectional views that schematically illustrate each manufacturing process of the multilayered wiring structure according to Embodiment 3 of the present invention in the process sequence. In Embodiment 3, a so-called Dual Damascene Cu wiring is formed wherein the via hole and the wiring trench, both of which are formed in the insulation film structure composed of silicon oxide film/porous SiOCH/silicon oxide film/SiOCH/silicon carbide-nitride film, are simultaneously embedded. In addition, similar to Embodiment 1, a part of the silicon oxide film is removed whereby TDDB reliability improves.

First, a SiOCH film 403, which will be a via hole interlayer insulation film, is formed on the top surface of the bottom wiring structure 401 by means of a silicon carbide-nitride film 402. The via hole interlayer film can be a porous SiOCH film, and further, a porous SiOCH film rigidized by UV irradiation or EB irradiation. Besides, a silicon oxide film 404, which will be an etching stopper, is formed on the top surface of the SiOCH film 403. As will be discussed below, the silicon oxide film will be an etching stopper when the trench interlayer insulation film is etched. As a trench interlayer insulation film, a porous SiOCH film 405 is formed on the top surface of the silicon oxide film 404. Further, as a low-k dielectric constant film cap, a silicon oxide film 406 is formed on the top surface of the porous SiOCH film 405. Next, an antireflection film 407 and a resist film 408 are formed on the top surface of the silicon oxide film 406; and further, a via-hole-opening resist pattern is formed on the resist film 408 by means of the photolithography technology [FIG. 8A(a)]. Subsequently, using as a mask the resist film 408 on which is formed the via-hole-opening pattern, the antireflection film 407, the silicon oxide film 406, the porous SiOCH film 405, the silicon oxide film 404 and the SiOCH film 403 are etched in series so that a via hole-shaped opening is formed. At this stage, etching to the SiOCH film 403 stops at the silicon carbide-nitride film 402, which is a Cu cap film [FIG. 8A(b)].

After removing the resist film 408 and the antireflection film 407 [FIG. 8A(c)], an antireflection film 409 is formed in the opening and on the silicon oxide film 405, and then, a resist film 410 is formed on the top surface of the antireflection film 409. At this stage, the antireflection film functions as a shield of a cap film of the bottom of the via hole (silicon carbide-nitride film 402). Further, using the photolithography technology, a resist pattern for a wiring trench is formed on the resist film 410 [FIG. 8A(d)].

Subsequently, the antireflection film 409, the silicon oxide film 406 and the porous SiOCH film 405 beneath the resist pattern trench are etched in series so that a wiring trench 411 is formed [FIG. 8B(e)]. At this stage, the cap film at the bottom of the via hole is shielded from the etching plasma by the antireflection film. The resist film 410 is removed by ashing, the antireflection film 409 is removed [FIG. 8B(f)], and the silicon carbide-nitride film 402 placed on the hole bottom is removed by etching, whereby a via hole 412 is formed so that a Dual Damascene structure is obtained [FIG. 8B(g)]. Next, a barrier layer 413 and a copper layer 414 are formed by sputtering and plating, and the unnecessary portion of the metal film is removed by means of the CMP, so that a conductive plug 415 and a trench wiring 416 are formed that embed the via hole 412 and the wiring trench 411, respectively [FIG. 8B(h)]. Then, through the same processes as shown in FIG. 6B(e) to FIG. 6B(g) of Embodiment 1, a trench wiring that is capped with a silicon carbide-nitride film 417 is formed [FIG. 7B(e) to FIG. 7B(g)].

In the Dual Damascene manufacturing method, when an inaccurate alignment causes the via hole to run off the edge of the wiring trench, the wiring is formed fat and the interwiring distance gets shorter, so that the TDDB withstand voltage will degrade. Since the TDDB withstand voltage improves by means of the structure according to the present invention in which a trench wiring protrudes from the surface of the silicon oxide film, and in which a top surface and a portion of a side surface of the trench wiring are coated with a silicon carbide-nitride film, the degradation of the TDDB withstand voltage resulting from the above-mentioned inaccurate alignment is inhibited.

The present Embodiment showed an embodiment in which a silicon carbide-nitride film is used as a Cu cap film. Nevertheless, any material can be used so long as the etching selectivity of the porous SiOCH film is ensured. In addition, any material can be used for the interlayer insulation film so long as it is of a low-k dielectric constant. Non-limiting examples of such a material include the CVD-SiOCH film such as Aurora series made by ASM JAPAN K.K., Orion made by Tricon, BD/BDII made by Applied Materials, Inc., and Coral made by Novellus Systems, Inc.; and the SiOCH-type coating film such as Porous SiLK made by Dow Chemical Company and NCS made by Catalysts & Chemicals Industries Co., Ltd. For example, in order to form a Dual Damascene structure as shown in FIG. 9, a conductive plug 515 and a trench wiring 516 are embedded in the insulation film, which is a laminated layer comprising a silicon carbide-nitride film 502, a porous SiOCH film 503, a silicon oxide film 504, a porous SiOCH film 505 and a rigid SiOCH film 506, wherein a porous SiOCH film such as Aurora can be used as a material for the via hole interlayer insulation film, or a rigid/porous SiOCH stack structure such as BD/Aurora can be used as a material for the trench interlayer insulation film. This structure can be obtained by forming on a rigid SiOCH film 506 a silicon oxide film as a low-k dielectric constant film cap film, and then by removing the cap oxide film at the time of the CMP. In this case, such a material as BD, having a carbon/silicon ratio (C/Si ratio) lower than 1, is preferably placed on the upper layer. This is because when the C/Si ratio is about 1 or less, or when the Cu/upper low-k dielectric constant film polishing rate ratio at the time of the Ta bather CMP is 1 or less, the defect due to the CMP can be reduced, as shown in FIGS. 10(a) and 10(b). Further, in a Dual Damascene structure as shown in FIG. 11 wherein a conductive plug 615 and a trench wiring 616 are embedded in an insulation film, which is a laminated film comprising a silicon carbide-nitride film 602, a porous SiOCH film 603, a porous SiOCH film 605 and a rigid SiOCH film 606, if a SiOCH film is employed which is formed by means of a plasma polymerization indicated in the Japanese Laid-open Patent Publication No. 2004-047873 as a trench interlayer insulation film material of the lower layer, then the SiOCH film has a C/Si ratio much greater than 1, whereby an etching selectivity is ensured between the SiOCH film and the porous SiOCH film 603, which is a via hole interlayer insulation film having low C/Si. At this stage, the silicon oxide film is not necessary any longer for an etching stopper, so that the effective relative dielectric constant can be kept low. Meanwhile, even in case that the rigid SiOCH film comes on the CMP surface, it is possible to make a structure in which only the portion adjacent to the Cu wiring is made lower by means of the dry etching.

In the present Embodiment, a method for forming a Dual Damascene was described according to which a via hole is firstly formed (via hole first manufacturing method). However, another method can be employed as shown in the Japanese Laid-open Patent Publication No. 2002-43419, wherein a two- to four-layered multi-layered hard mask comprising a silicon oxide film and a silicon nitride is used, each layer having different etching properties, and a via hole pattern and a wiring trench pattern are formed on the hard mask, and then, a low relative dielectric constant film is etched using this hard mask.

Embodiment 4

<Metal Cap>

FIGS. 12(a) to 12(d) are sectional views that schematically illustrate each manufacturing process of the multilayered wiring structure according to Embodiment 4 of the present invention in the process sequence. In Embodiment 4, a Cu wiring is formed in the trench of a silicon oxide film/porous SiOCH/silicon carbide-nitride film, and further, several types of metal compounds different from those of the wiring material are selectively formed only on the top of the Cu wiring. In addition, an improved TDDB withstand voltage is achieved by removing a part of the silicon oxide film.

First, the processes similar to FIGS. 6A(a) to 6B(e) representing Embodiment 1 are taken to form a trench wiring in the interlayer insulation film [FIG. 12(a)]. Meanwhile, in FIG. 12, the parts equivalent to those in FIGS. 6A and 6B that represent Embodiment 1 are assigned the reference numerals the last two digits of which are shared in common, and thus, the redundant descriptions will be omitted. Then, a CoWP film 716 as a metal cap film is selectively made to grow only on the trench wiring 713 by means of the electroless plating method [FIG. 12(b)]. Next, a portion adjacent to the wiring of the polished surface of the silicon oxide film is etched by means of dry etching or wet etching as shown in FIGS. 1 to 3 [FIG. 12(c)], and further, a silicon carbide-nitride film (SiCN) 214 is formed as a Cu cap film by means of, for example, the CVD method [FIG. 12(d)].

This method allows for a solution to the problems in the selective growth of the metal cap. In other words, the metal residue on the oxide film is removed at the time of the oxide film etching, and thus, the method is effective for ensured insulation on the metal cap. Naturally, TDDB withstand voltage also improves. Further, the top surface of the insulation film not in proximity of the wiring is flat and generally as high as the top surface of the Cu, and thus, planarization treatment of the via hole interlayer insulation film is not required. Still further, since the level difference is thus minimized, the exposure margin for forming the via hole increases, whereby the reliability of the via hole formation improves.

Embodiment 5

<Air-Gap>

FIGS. 13(a) to 13(d) are sectional views that schematically illustrate each manufacturing process of the multilayered wiring structure according to Embodiment 5 of the present invention in the process sequence. In Embodiment 5, a Cu wiring is formed in the trench of the silicon oxide film/porous SiOCH film/silicon carbide-nitride film, and a part of the silicon oxide film is removed to provide a level difference, and then a Cu cap film and a via hole interlayer insulation film are formed, when a cavity is formed. The TDDB withstand voltage improves while the interwiring capacitance is reduced.

First, the processes similar to FIGS. 6A(a) to 6B(e) showing Embodiment 1 are taken to form a trench wiring in the interlayer insulation film [FIG. 13(a)]. Meanwhile, in FIG. 13, the parts equivalent to those in FIGS. 6A and 6B that represent Embodiment 1 are assigned the reference numerals the last two digits of which are shared in common, and thus, the redundant descriptions will be omitted. Next, a portion adjacent to the wiring of the polished surface of the silicon oxide film is etched by means of dry etching or wet etching as shown in FIGS. 3 to 5 [FIG. 13(b)]. By controlling the depth of etching, the size and shape of the pore to be formed later can be controlled. Further, a silicon carbide-nitride film 814 is formed as a Cu cap film by means of, for example, the CVD method [FIG. 13(c)]. Next, a SiOCH film 817, for example, is formed as a via hole interlayer film. At this stage, a cavity 818 can be generated as shown in FIG. 13(d). As a result, the interwiring capacitance can be reduced. Next, the SiOCH film 817 is polished by means of the CMP method so that the planarity is ensured, whereby a structure shown in FIG. 13(d) can be obtained. Then, repetition of the processes of formation etc. of the conductive plug, the interlayer insulation film and the trench wiring enables formation of a multilayered wiring.

Although the present invention has been described with reference to several preferred embodiments and working examples, it should be appreciated that these embodiments and examples have been shown by means of example of the present invention and that they are therefore not to be considered limiting the scope thereof. It should be clear that any skilled person, after reading the present specification, could make modifications or substitutions using equivalent components and technologies. However, it should also be clear that such modifications or substitutions would still be covered by the true scope and spirit of the appended Claims.

What is claimed is:

1. A multilayered wiring structure which is a wiring structure comprising:
   a first insulation film;
   a wiring trench formed on the first insulation film; and
   a wiring embedded in the wiring trench,
   wherein the multilayered wiring structure is provided with:
   an interwiring central region of the first insulation film the top surface of which is arranged to be at the height generally equal to the height of the top surface of the wiring; and
   a peripheral region of the wiring of the first insulation film the top surface of which is arranged to be at the height lower than the top surface of the wiring.

2. The multilayered wiring structure according to claim 1, comprising a second insulation film that covers the top surface of the wiring, a part of the side surface of the top surface, and the top surface of the first insulation film.

3. The multilayered wiring structure according to 2, comprising a third insulation film on the second insulation film, and further comprising a cavity in the third insulation film.

4. The multilayered wiring structure according to claim 1 or 2, wherein at least a part of the first insulation film has a relative dielectric constant lower than that of a silicon oxide film.

5. The multilayered wiring structure according to claims 1 or 2, wherein at least a part of the first insulation film is a porous film.

6. The multilayered wiring structure according to claim 1 or 2, comprising a sidewall insulation film on the side surface of the wiring trench.

7. The multilayered wiring structure according to claim 1 or 2, comprising a fourth insulation film that is provided with a via hole for contacting the lower conductive layer, wherein the conductive plug embedded in the via hole is connected to the wiring.

8. The multilayered wiring structure according to claim 7, wherein the wiring trench and the via hole are simultaneously formed, both of which are embedded with a conductor.

9. The multilayered wiring structure according to claim 1 or 2, wherein a metal compound film of a composition different from that of the material of the wiring is selectively formed on the wiring.

10. A method for manufacturing a multilayered wiring, comprising:
   (1) forming the first and second insulation films so that the first insulation film will be upper;
   (2) forming a wiring trench on the first insulation film and a via hole on the second insulation film, respectively;
   (3) forming a conductive layer to embed the via hole and the wiring trench;
   (4) removing the conductive layer formed on the first insulation film to form a wiring of a desired pattern, with the wiring being connected to the conductive plug embedded in the via hole; and
   (5) etching the surface of the first insulation film,
   wherein the multilayered wiring is fabricated in such a manner that the wiring protrudes from the surface of the first insulation film, and that the top surface of the first insulation film at the interwiring central region has generally the same height as the top surface of the wiring.

11. The method for manufacturing a multilayered wiring according to claim 10, wherein the first insulation film comprises: a first low-relative-dielectric-constant insulation film having a relative dielectric constant lower than that of a silicon dioxide; and a first high-density insulation film that is denser than the first low-relative-dielectric-constant insulation film, and wherein the second insulation film comprises: an etching stopper film; a second low-relative-dielectric-constant insulation film having a relative dielectric constant lower than a silicon dioxide; and a second high-density insulation film that is denser than the second low-relative-dielectric-constant insulation film.

12. The method for manufacturing a multilayered wiring according to claim 10, wherein the first insulation film comprises: a low-relative-dielectric-constant insulation film having a relative dielectric constant lower than that of a silicon dioxide; and a plurality of hard mask layers that is denser than the low-relative-dielectric-constant insulation film, with each of the hard mask layers having different etching properties, and wherein in the process (2), a wiring trench pattern is formed on one hard mask layer while a via hole pattern is formed on the other hard mask layer, and the remaining portion of the first insulation film and the second insulation film are etched using the hard mask layer as a mask.

13. A method for manufacturing a multilayered wiring, comprising
   (1) forming a first insulation film;
   (2) forming a wiring trench on the first insulation film;
   (3) forming a conductive layer to embed the wiring trench;
   (4) removing the conductive layer on the first insulation film to form a wiring of a desired pattern; and
   (5) etching the surface of the first insulation film,
   wherein the multilayered wiring is fabricated in such a manner that the wiring protrudes from the surface of the first insulation film, and that the top surface of the first insulation film at the interwiring central region has generally the same height as the top surface of the wiring.

14. The method for manufacturing a multilayered wiring according to claim 13, wherein the first insulation film comprises: an etching stopper film; a low-relative-dielectric-constant insulation film having a relative dielectric constant lower than that of a silicon dioxide; and a high-density insulation film that is denser than the low-relative-dielectric-constant insulation film.

15. The method for manufacturing a multilayered wiring according to any one of claims 14, 11 and 12, wherein the etching stopper film is made of carbide-nitride silicon, silicon carbide, silicon nitride or silicon oxynitride.

16. The method for manufacturing a multilayered wiring according to any one of claims 14, 11 and 12, wherein the low-relative-dielectric-constant insulation film, or either of the first low-relative-dielectric-constant insulation film and the second low-relative-dielectric-constant insulation film is made of SiOCH.

17. The method for manufacturing a multilayered wiring according to claim 14 or 11, wherein the high-density insulation film, or either of the first high-density insulation film and the second high-density insulation film is made of silicon oxide, silicon oxynitride, silicon nitride or silicon carbide.

18. The method for manufacturing a multilayered wiring according to claim 13 or 10, wherein at the beginning of film formation, the first insulation film comprises a low-relative-dielectric-constant insulation film and a low-relative-dielectric-constant insulation film cap layer that covers the low-relative-dielectric-constant insulation film, and wherein the low-relative-dielectric-constant insulation film cap layer is removed in the process (4).

19. The method for manufacturing a multilayered wiring according to claim 18, wherein the low-relative-dielectric-constant insulation film comprises a porous SiOCH film and a rigid SiOCH film formed thereon.

20. The method for manufacturing a multilayered wiring according to any one of claims 13 to 12, wherein the process (4) is conducted by means of the CMP (chemical mechanical polishing) method.

21. The method for manufacturing a multilayered wiring according to any one of claims 13 to 12, wherein in the process (4), the top surface of the conductive layer is fabricated to be lower than that of the first insulation film.

22. A semiconductor device having a multilayered wiring structure which is a wiring structure comprising:
a first insulation film;
a wiring trench formed on the first insulation film; and
a wiring embedded in the wiring trench, wherein the multilayered wiring structure is provided with:
an interwiring central region of the first insulation film the top surface of which is arranged to be at the height generally equal to the height of the top surface of the wiring; and
a peripheral region of the wiring of the first insulation film the top surface of which is arranged to be at the height lower than the top surface of the wiring.

* * * * *

UNITED STATES PATENT AND TRADEMARK OFFICE
CERTIFICATE OF CORRECTION

PATENT NO. : 7,999,391 B2  
APPLICATION NO. : 12/278339  
DATED : August 16, 2011  
INVENTOR(S) : Hiroto Ootake et al.

Page 1 of 1

It is certified that error appears in the above-identified patent and that said Letters Patent is hereby corrected as shown below:

In the Specification

Column 1, Line 10: delete "Aug. 16, 2007." and insert -- Feb. 6, 2006. --

Signed and Sealed this  
Twenty-ninth Day of April, 2014

Michelle K. Lee  
*Deputy Director of the United States Patent and Trademark Office*